United States Patent
Kwon (12)

(10) Patent No.: US 6,218,246 B1
(45) Date of Patent: Apr. 17, 2001

(54) FABRICATION METHOD OF TRIPLE POLYSILICON FLASH EEPROM ARRAYS

(75) Inventor: Wook-Hyun Kwon, Cheonju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/285,886

(22) Filed: Apr. 7, 1999

(30) Foreign Application Priority Data

Dec. 31, 1998 (KR) .................................................. 98/63528

(51) Int. Cl.[7] .................................................. H01L 21/336
(52) U.S. Cl. ............................................. 438/267; 438/266
(58) Field of Search ............................... 438/257, 263, 438/264, 266, 267

(56) References Cited

U.S. PATENT DOCUMENTS

| 5,686,332 | * | 11/1997 | Hong ..................................... 438/266 |
| 5,712,179 | * | 1/1998 | Yuan ..................................... 437/43 |
| 5,838,039 | * | 11/1998 | Sato et al. ............................. 257/321 |
| 5,874,759 | * | 2/1999 | Park ..................................... 257/314 |

* cited by examiner

*Primary Examiner*—Chandra Chaudhari
*Assistant Examiner*—Jack Chen
(74) *Attorney, Agent, or Firm*—Morgan, Lewis & Bockius LLP

(57) ABSTRACT

A fabrication method of triple polysilicon flash EEPROM arrays according to the present invention includes forming a gate oxide layer on a semiconductor substrate having a source and a drain, forming a first polysilicon strip on said gate oxide layer in a first direction, forming a dielectric layer on said first polysilicon strip, forming second polysilicon strips on said dielectric layer in a second direction which is perpendicular to the first direction, forming oxide strips respectively on said second polysilicon strips, forming spacers at both side-walls of said oxide strips and said second polysilicon strips respectively formed thereon, forming a third polysilicon layer over the resultant structure, forming in the second direction masking strips which define erase gate regions on said third polysilicon layer, and forming individual erase gates and floating gates by sequentially etching the third polysilicon layer, the dielectric layer and the first polysilicon strip.

13 Claims, 3 Drawing Sheets

_(US 6,218,246 B1)_

FABRICATION METHOD OF TRIPLE POLYSILICON FLASH EEPROM ARRAYS

BACKGROUND OF THE INVENTION

1. Field of the Invention

The present invention relates to a fabrication method of a nonvolatile memory device, and more particularly to a fabrication method of triple polysilicon flash EEPROM arrays.

2. Description of the Conventional Art

FIGS. 1A through 1E illustrate a conventional fabrication method of triple polysilicon flash EEPROM arrays, the method being disclosed in U.S. Pat. No. 5,712,179.

First, as shown in FIG. 1A, a first polysilicon strip 77 is formed in a first direction on a semiconductor substrate 31 having a source and a drain, and second polysilicon strips 56, 55, 53, 51, 58 are formed on the first polysilicon strip 77 in a second direction. A gate oxide layer 73 separates the first strip 77 from the substrate 31, and a dielectric layer 103 separates the second strips from the first strip 77, the first strip 77 later being separated into individual floating gates and the second polysilicon strips serving as control gates. Further, oxide strips 113, 115, 117, 119, 120 are positioned to cover top surfaces of the respective control gates 56, 55, 53, 51, 58.

In FIG. 1B, temporary masking strips 305, 309 are formed along one side of each of the control gate strips 53, 55, the first polysilicon strip 77 is partially etched, through a mask consisting of the masking strips 305, 309 and the oxide strips 115, 117, 119, to be separated into floating gates 301, 303, 305 and then the masking strips 305, 309 are removed. Here, the masking strips 115, 117, 119 are preferably formed by depositing a layer of photoresist material over the structure, exposing it to optical radiation through a mask and then dissolving portions to leave the desired masking strips behind.

As shown in FIG. 1C, an oxide layer about 1500 Å thick is deposited by a chemical vapor deposition (CVD) process over the entire structure to completely fill the spaces between control gates 51, 53, 55, and then the oxide layer is then anisotropically etched until substantially the surfaces of the oxide strips 115, 117, 119 are exposed. As a result, spacers 317, 323 are formed along the vertical edges of the floating gates 301, 303, the control gates 51, 53, 55 are physically separated and electrically insulated by spacers 313, 315, 319, 321, 325 formed at side walls in the spaces between the rows and there are exposed portions 327, 329 of an upper surface of the floating gates 55, 53, respectively.

Next, portions of the floating gate edges are removed by etching, using a mask formed of the spacers 315, 319, and the oxide strips 115 and 117, as shown in FIG. 1D. A tunnel dielectric layer 331 is then grown over that newly exposed polysilicon edge.

In FIG. 1E, a third polysilicon layer is deposited over the structure with a thickness sufficient to fill in the spaces between the control gates 51, 53, 55 and then erase gates 335, 337, 339 are formed by photo-etching the third polysilicon layer. As a result, the erase gate 337, for example, is coupled through the tunnel dielectric layer 331 with the floating gate 301 but is maintained a sufficient distance from the opposite floating gate 303 by the spacer 314.

However, such method of fabricating the conventional flash EEPROM arrays has several problems. More specifically, the exposed side wall of the floating gate is not vertically formed due to the inclination of the side-wall spacer which is not right-angled after the etching process for exposing the edge of the floating gate, where the tunnel dielectric layer is to be formed, by using the mask formed of the controls gates and the side-wall spacer thereof. Therefore, the tunnel dielectric layer formed at such side wall vibrates the coupling of the control gates and the erasing properties of the erase gates are electrically unstable, which results in deterioration of the reliability of the semiconductor device.

In addition, since the insulation between the erase gate which erases the floating gate and the adjacent floating gate is accomplished through the corresponding side-wall spacer, the side-wall spacer should be thickly formed sufficient to have the complete insulation. Therefore, it is not suitable to memory cell arrays with large scale integration in which the distance between the control gates becomes smaller.

SUMMARY OF THE INVENTION

Accordingly, the present invention is directed to a fabrication method of triple polysilicon flash EEPROM arrays which obviates the problems and disadvantages due to the conventional art.

An object of the present invention is to provide a fabrication method of triple polysilicon flash EEPROM arrays that is suitable to memory cell arrays with large scale integration since each erase gate which erases one floating gate maintains sufficient distance with an opposite floating gate.

Also, another object of the present invention is to provide a fabrication method of triple polysilicon flash EEPROM arrays that uses portions of a dielectric layer as tunnel electric layers for thereby electrically stabilizing erasing properties for which electrons accumulated in floating gates are removed through the tunnel electric layers.

To achieve these and other advantages and in accordance with the purpose of the present invention, as embodied and broadly described, according to an embodiment, there is provided a fabrication method of triple polysilicon flash EEPROM arrays, including forming a gate oxide layer on a semiconductor substrate having a source and a drain, forming a first polysilicon strip on said gate oxide layer in a first direction, forming a dielectric layer on said first polysilicon strip, forming second polysilicon strips on said dielectric layer in a second direction which is perpendicular to the first direction, forming oxide strips respectively on said second polysilicon strips, forming spacers at both side-walls of said oxide strips and said second polysilicon strips respectively formed thereon, forming a third polysilicon layer over the resultant structure, forming in the second direction masking strips which define erase gate regions on said third polysilicon layer, and forming individual erase gates and floating gates by sequentially etching the third polysilicon layer, the dielectric layer and the first polysilicon strip.

Further, to achieve the above objects, there is provided a fabrication method of triple polysilicon flash EEPROM arrays, according to another embodiment, which includes forming a gate oxide layer on a semiconductor substrate having a source and a drain, forming a first polysilicon strip on said gate oxide layer in a first direction, forming a dielectric layer on said first polysilicon strip, forming second polysilicon strips on said dielectric layer in a second direction which is perpendicular to the first direction, forming oxide strips respectively on said second polysilicon strips, forming spacers at both side-walls of said oxide strips and said second polysilicon strips respectively formed thereon, removing portions of said oxide strips and the spacers formed at one side of the side-walls of said oxide strips by a photo-etching process, forming a third polysilicon layer over the resultant structure, forming in the second direction masking strips which define erase gate regions on said third polysilicon layer, and forming individual erase gates and floating gates by sequentially etching the third polysilicon layer, the dielectric layer and the first polysilicon strip.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

FIGS. 2A through 2D sequentially illustrate a fabrication method of triple polysilicon flash EEPROM arrays according to a first embodiment of the present invention.

Figure 1A:
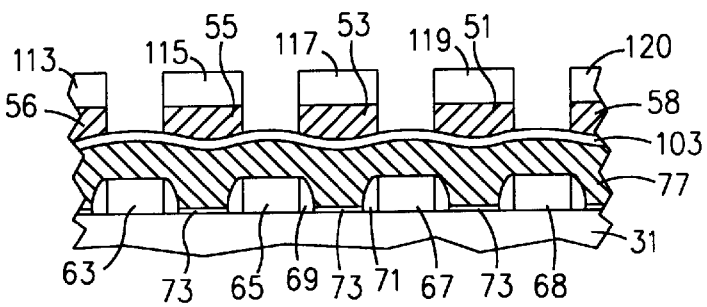
FIGS. 1A through 1E sequentially illustrate, in cross-sectional views, a fabrication method of conventional triple polysilicon flash EEPROM arrays.
Figure 1B:
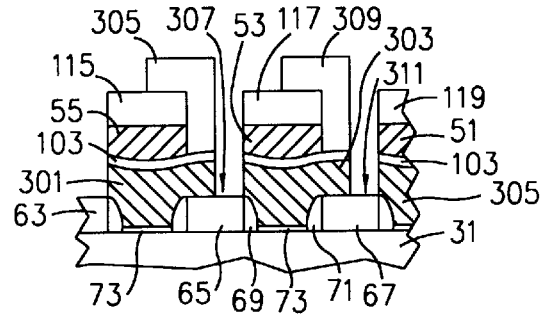
Figure 1C:
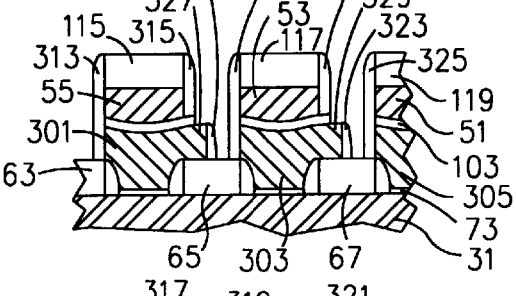
Figure 1D:
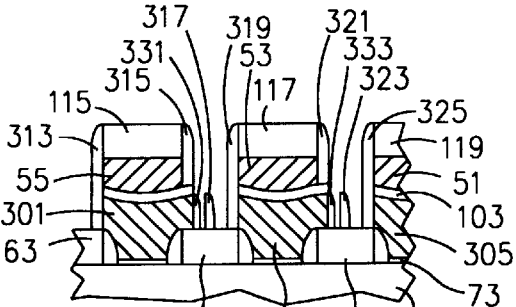
Figure 1E:
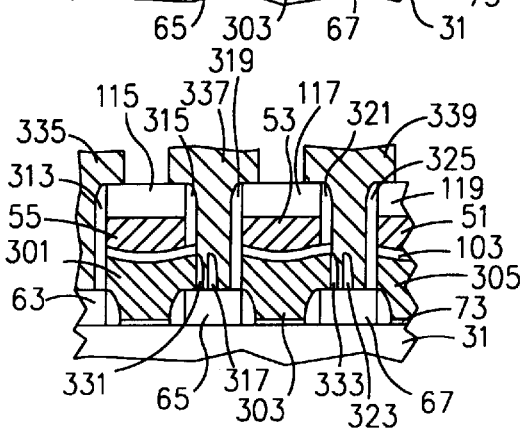
Figure 2A:
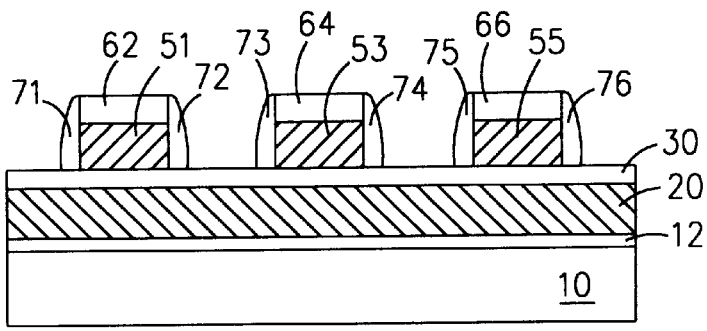
FIGS. 2A through 2D sequentially illustrate, in cross-sectional views, a fabrication method of triple polysilicon flash EEPROM arrays according to a first embodiment of the present invention.

FIG. 2A illustrates a semiconductor substrate 10 having a drain and a source on which a first polysilicon strip 20 is deposited in a first direction and second polysilicon strips, control gates, 51, 53, 55 are formed on the first silicon strip 20 in a second direction which is perpendicular to the first direction. Further, oxide strips 62, 64, 66 are formed on the second polysilicon strips 51, 53, 55, respectively, and there are formed insulating spacers 71, 72, 73, 74, 75, 76 at side walls of the second polysilicon strips 51, 53, 55 with the oxide strips 62, 64, 66 formed thereon. The first polysilicon strip 20 is separated from the substrate 10 by a gate oxide layer 12 and the second polysilicon strips 51, 53, 55 are separated from the first polysilicon strip 20 by a dielectric layer 30 formed of layer insulation material such as oxide, an oxide-nitride-oxide (ONO), borophosphosilicate glass (BPSG), spin-on glass (SOG) or plasma enhanced tetraethylorthosilicate (PE-TEOS), the first polysilicon strip 20 later being separated into individual floating gates and the second polysilicon strips serving as control gates.

Figure 2B:
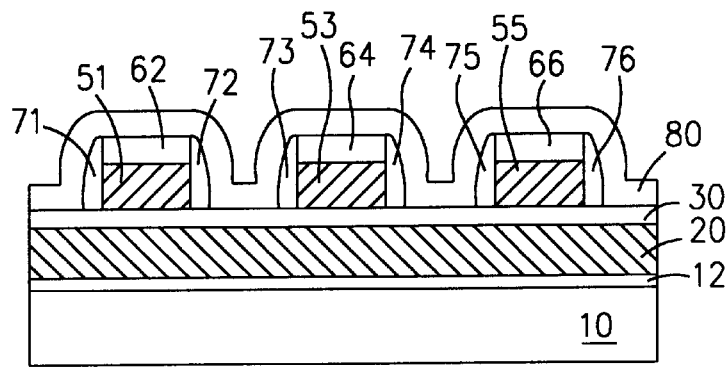

As shown in FIG. 2B, a third polysilicon layer 80 is sufficiently thick deposited over the resultant structure in the same direction of the first polysilicon strip 20 by CVD, the third polysilicon layer 80 later being separated into individual erase gates.

Figure 2C:
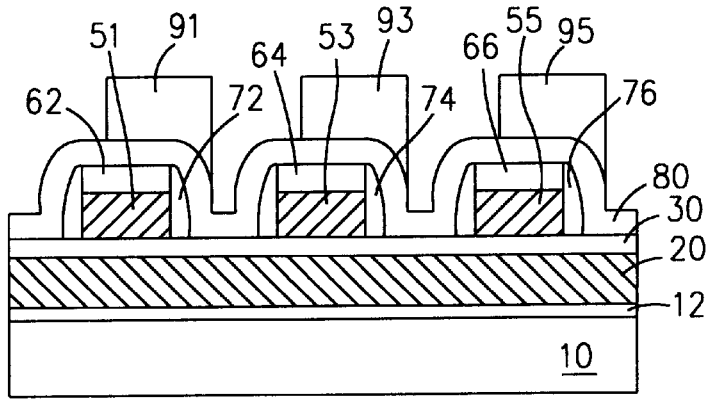

Next, as shown in FIG. 2C, masking strips 91, 93, 95 are formed in the second direction on the third polysilicon layer 80, the third polysilicon layer 80 later being separated into individual erase gates and the masking strips 91, 93, 95 being formed by depositing a layer of photoresist material over the structure, exposing to optical radiation and then developing the layer to cover portions of an upper surface of the third polysilicon layer to be formed as erase gates.

Figure 2D:
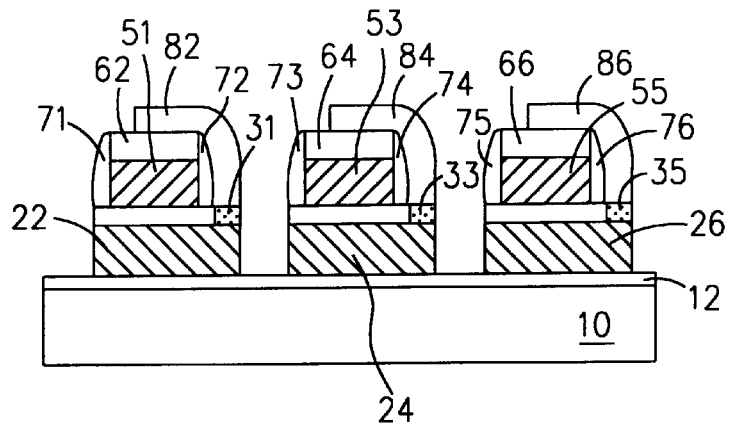

In FIG. 2D, by using a mask consisting of the masking strips 91, 93, 95, the third polysilicon layer 80, the dielectric layer 30 and the first polysilicon strip 20 are sequentially etched. Thus, the first polysilicon strip 20 is separated into floating gates 22, 24, 26 and the third polysilicon layer 80 is separated into erase gates 82, 84, 86, the erase gates 82, 84, 86 being coupled through tunnel dielectric layers 31, 33, 35 to the floating gates 22, 24, 26, respectively.

In addition, FIGS. 3A through 3D sequentially illustrate a fabrication method of triple polysilicon flash EEPROM arrays according to a second embodiment of the present invention.

Figure 3A:
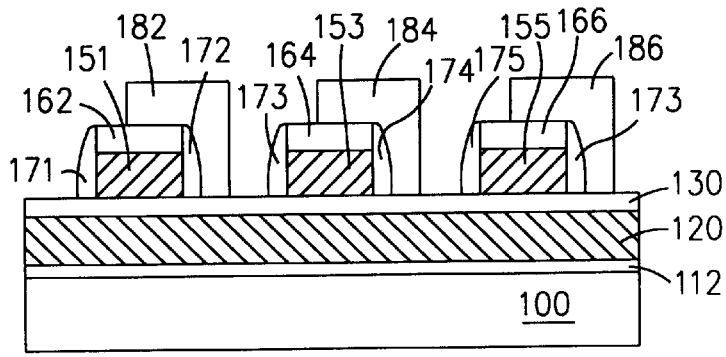
FIGS. 3A through 3D sequentially illustrate, in cross-sectional views, a fabrication method of triple polysilicon flash EEPROM arrays according to a second embodiment of the present invention.

As shown in FIG. 3A, there is provided a semiconductor substrate 100 having a drain and a source on which a first polysilicon strip 120 is deposited in a first direction and second polysilicon strips, control gates, 151, 153, 155 are formed on the first silicon strip 120 in a second direction which is perpendicular to the first direction. The first polysilicon strip 120 is separated from the substrate by a gate oxide layer 112 and the second poly silicon strips 151, 153, 155 are separated from the first polysilicon strip 120 by a dielectric layer 130 formed of the layer insulation material such as an oxide, ONO, BPSG, SOG or PE-TEOS, the first polysilicon strip 120 being separated into individual floating gates and each of the second polysilicon strips 151, 153, 155 serving as a control gate. Further, oxide strips 162, 164, 166 are formed on the second polysilicon strips 151, 153, 155, respectively, there are formed insulating spacers 171, 172, 173, 174, 175, 176 at side walls of the second polysilicon strips 151, 153, 155 with the oxide strips 162, 164, 166 formed thereon and then first masking strips 182, 184, 186 are respectively formed along the spacers 172, 174, 176 at one sides of the second polysilicon strips 151, 153, 155. Here, it is noted that the masking strips 182, 184, 186 are formed by depositing a layer of photoresist material over the structure, exposing it to optical radiation through a mask and then developing portions to leave the desired masking strips behind.

Figure 3B:
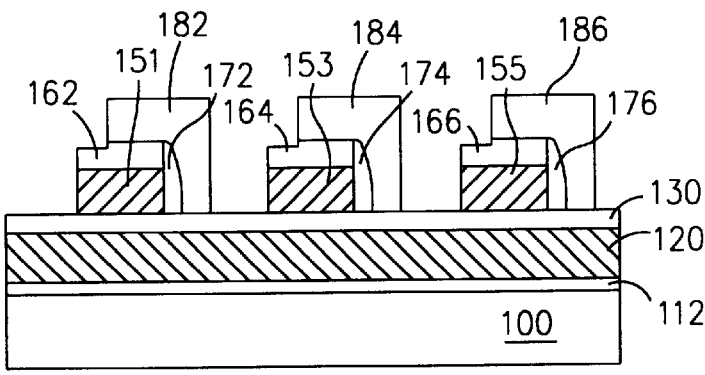

In FIG. 3B, the spacers 171,173,175 respectively formed at the other side of the second polysilicon strips 151, 153, 155 and exposed upper surface portions of the oxide strips 162, 164, 166 are removed by using a mask formed of the first masking strips 182, 184, 186, and then the first masking strips 182, 184, 186 are removed.

Figure 3C:
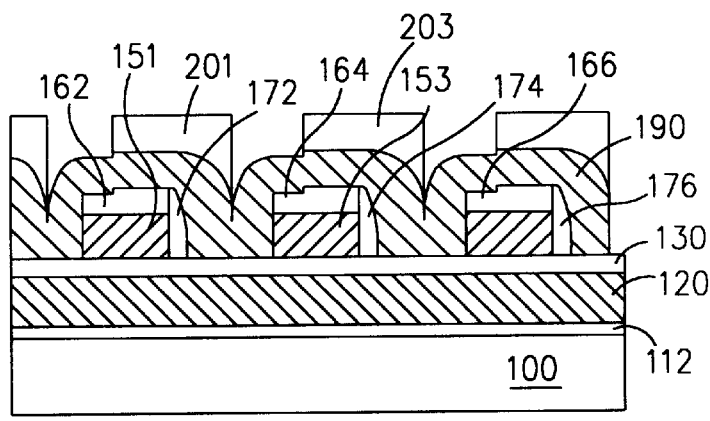

As shown in FIG. 3C, a third polysilicon layer 190 is sufficiently thick deposited over the resultant structure in the same direction of the first polysilicon strip 20 by CVD, and then second masking strips 201, 203, 205 are formed on the third polysilicon layer 190 in the second direction, the third polysilicon layer 190 later being formed individual erase gates and the second masking strips 201, 203, 205 being formed by depositing a layer of photoresist material over the structure, exposing and then dissolving the layer to cover predetermined portions of the third polysilicon layer to be formed as erase gates.

Figure 3D:
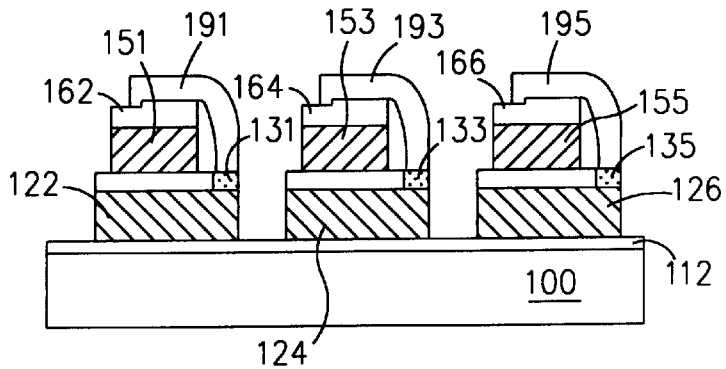

In FIG. 3D, by using a mask consisting of the second masking strips 201, 203, 205, the third polysilicon layer 190, the dielectric layer 130 and the first polysilicon strip 120 are sequentially etched. Thus, the first polysilicon strip 120 is separated into floating gates 122, 124, 126 and the third polysilicon layer 190 is separated into erase gates 191, 193, 195, the erase gates 191, 193, 195 being coupled through tunnel dielectric layers 131, 133, 135 to the floating gates 122, 124, 125, respectively.

As described above, the fabrication method of the triple polysilicon flash EEPROM arrays according to the present invention has advantages in that, first, the device fabrication process can be simplified since the floating gates, the tunnel dielectric layers and the erase gates are formed by the single photo-etching process, second, each erase gate which erases one floating gate maintains the sufficient distance with an opposite floating gate, thereby being suitable to the memory cell arrays with large scale integration and, third, since the portions of the dielectric layers are used as the tunnel dielectric layers, the size of the arrays can be uniformly maintained, even though there are some errors in aligning and focusing in the photo-etching process defining the control gates and the floating gates, which has an effect of electrically stabilizing the erasing properties for which electrons accumulated in the floating gates are removed through the tunnel dielectric layers by the erase gates.

It will be apparent to those skilled in the art that various modifications and variations can be made in the fabrication method of the triple polysilicon flash EEPROM arrays of the present invention without departing from the spirit or scope of the invention. Thus, it is intended that the present invention cover the modifications and variations of this invention provided they come within the scope of the appended claims and their equivalents.

What is claimed is:

1. A fabrication method of triple polysilicon flash EEPROM arrays, comprising:

forming a gate oxide layer on a semiconductor substrate having a source and a drain;

forming a first polysilicon strip on said gate oxide layer in a first direction;

forming a dielectric layer on said first polysilicon strip;

forming second polysilicon strips on said dielectric layer in a second direction which is perpendicular to the first direction;

forming oxide strips respectively on said second polysilicon strips;

forming spacers at both side-walls of said oxide strips and said second polysilicon strips respectively formed thereon;

forming polysilicon layer over the oxide strips, along the spacers and over the dielectric layer;

forming in the second direction masking strips which define erase gate regions on said polysilicon layer; and forming individual erase gates and floating gates by sequentially etching the polysilicon layer, the dielectric layer and the first polysilicon strip.

2. The fabrication method of the triple polysilicon flash EEPROM arrays of claim 1, wherein the erase gates are respectively coupled through portions of the dielectric layer to the floating gates.

3. The fabrication method of the triple polysilicon flash EEPROM arrays of claim 2, wherein each of the portions of the dielectric layer is a tunnel dielectric layer.

4. The fabrication method of the triple polysilicon flash EEPROM arrays of claim 1, wherein the erase gates have a one-to-one correspondence with the floating gates, so that one floating gate is erased by one erase gate.

5. The fabrication method of the triple polysilicon flash EEPROM arrays of claim 1, wherein the dielectric layer is formed of BPSG, SOG or PE-TEOS.

6. The fabrication method of the triple polysilicon flash EEPROM arrays of claim 1, wherein the masking steps are formed by depositing photoresist material over the polysilicon layer and patterning the photoresist material by exposing the photoresist material to optical radiation and developing the photoresist material so that one erase gate is correspondingly formed on one floating gate.

7. A fabrication method of triple polysilicon flash EEPROM arrays, comprising:

forming a gate oxide layer on a semiconductor substrate having a source and a drain;

forming a first polysilicon strip on said gate oxide layer in a first direction;

forming a dielectric layer on said first polysilicon strip;

forming second polysilicon strips on said dielectric layer in a second direction which is perpendicular to the first direction;

forming oxide strips respectively on said second polysilicon strips;

forming spacers at both side-walls of said oxide strips and said second polysilicon strips respectively formed thereon;

removing portions of said oxide strips and the spacers formed at one side of the side-walls of said oxide strips by a photo-etching process;

forming a third polysilicon layer over the oxide strips, along the spacers and over the dielectric layer;

forming in the second direction masking strips which define erase gate regions on said polysilicon layer; and forming individual erase gates and floating gates by sequentially etching the polysilicon layer, the dielectric layer and the first polysilicon strip.

8. The fabrication method of the triple polysilicon flash EEPROM arrays of claim 7, wherein the erase gates are respectively coupled through portions of the dielectric layer to the floating gates.

9. The fabrication method of the triple polysilicon flash EEPROM arrays of claim 8, wherein each of the portions of the dielectric layer is a tunnel dielectric layer.

10. The fabrication method of the triple polysilicon flash EEPROM arrays of claim 7, wherein the erase gates have a one-to-one correspondence with the floating gates, so that one floating gate is erased by one erase gate.

11. The fabrication method of the triple polysilicon flash EEPROM arrays of claim 7, wherein the dielectric layer is formed of BPSG, SOG or PE-TEOS.

12. The fabrication method of the triple polysilicon flash EEPROM arrays of claim 7, wherein the masking strips are formed by depositing photoresist material over the polysilicon layer and patterning the photoresist material by exposing to optical radiation and developing the photoresist material so that one erase gate is correspondingly formed on one floating gate.

13. The fabrication method of the triple polysilicon flash EEPROM arrays of claim 7, wherein the photo-etching process comprises:

forming the masking strips over said second polysilicon strips and along said spacers which are respectively formed at one side of the oxide strips, wherein portions of said oxide strips and said spacers are exposed; and selectively etching the exposed portions of upper surfaces of said oxide strips and said spacers using a mask consisting of said masking strips.

* * * * *